United States Patent
Kadow et al.

(10) Patent No.: US 8,097,918 B2
(45) Date of Patent: Jan. 17, 2012

(54) SEMICONDUCTOR ARRANGEMENT INCLUDING A LOAD TRANSISTOR AND SENSE TRANSISTOR

(75) Inventors: Christoph Kadow, Neuried (DE); Markus Leicht, Villach (AT); Stefan Woehlert, Villach (AT)

(73) Assignee: Infineon Technologies AG, Neubiberg (DE)

(*) Notice: Subject to any disclaimer, the term of this patent is extended or adjusted under 35 U.S.C. 154(b) by 132 days.

(21) Appl. No.: 12/541,635

(22) Filed: Aug. 14, 2009

(65) Prior Publication Data

US 2011/0037126 A1    Feb. 17, 2011

(51) Int. Cl.
    *H01L 29/78* (2006.01)
(52) U.S. Cl. ............... 257/332; 257/334; 257/E29.028
(58) Field of Classification Search .......... 257/329, 257/330, 331, 332, 401, E29.028
    See application file for complete search history.

(56) References Cited

U.S. PATENT DOCUMENTS

| | | | | |
|---|---|---|---|---|
| 5,821,580 A | * | 10/1998 | Kuwahara ............... | 257/330 |
| 2008/0001221 A1 | * | 1/2008 | Yoshimura et al. ....... | 257/331 |
| 2008/0138953 A1 | * | 6/2008 | Challa et al. ............. | 438/270 |
| 2009/0039869 A1 | * | 2/2009 | Williams ................. | 324/123 R |
| 2010/0102845 A1 | | 4/2010 | Kadow et al. | |
| 2010/0134086 A1 | | 6/2010 | Theil | |
| 2010/0230764 A1 | | 9/2010 | Meyer et al. | |

FOREIGN PATENT DOCUMENTS

| | | |
|---|---|---|
| DE | 10042585 C1 | 11/2002 |
| DE | 10120524 A1 | 11/2002 |
| DE | 102004041886 A1 | 3/2006 |
| DE | 102005009544 A1 | 9/2006 |

* cited by examiner

*Primary Examiner* — Jerome Jackson, Jr.
*Assistant Examiner* — Paul Budd
(74) *Attorney, Agent, or Firm* — Dicke, Billig & Czaja, PLLC (57) ABSTRACT

A semiconductor arrangement including a load transistor and a sense transistor that are integrated in a semiconductor body. One embodiment provides a number of transistor cells integrated in the semiconductor body, each transistor cell including a first active transistor region. A number of first contact electrodes, each of the contact electrodes contacting the first active transistor regions through contact plugs. A second contact electrode contacts a first group of the first contact electrodes, but not contacting a second group of the first contact electrodes. The transistor cells being contacted by first contact electrodes of the first group form a load transistor, with the second electrode forming a load terminal of the load transistor. The transistor cells being contacted by first contact electrodes of the second group form a sense transistor.

14 Claims, 11 Drawing Sheets

SEMICONDUCTOR ARRANGEMENT INCLUDING A LOAD TRANSISTOR AND SENSE TRANSISTOR

TECHNICAL FIELD

The present disclosure relates to a semiconductor arrangement including a load transistor and a sense transistor.

BACKGROUND

Transistors, in particular MOS transistors, like MOSFET or IGBT, can be used as electronic switches. In those applications a load path of the transistor is connected in series to the load, with the series circuit including the transistor and the load being connected between voltage supply terminals. The transistor can be switched on and off by applying a suitable control signal to its control input.

In many applications it is desired to measure the current through the load. For measuring the current through a load a sense transistor may be used. The sense transistor is coupled to the load transistor and may be operated in the same operation point as the load transistor. If the load transistor and the sense transistor are operated in the same operation point, a sense current flowing through the sense transistor is proportional to a current flowing through the load transistor. A proportionality factor between the load current and the sense current is dependent on the ratio between the active transistor areas (channel areas) of the sense transistor and the load transistor.

The proportionality factor is equal to the ratio between the active device areas, if the load transistor and the sense transistor have identical device characteristics. However, in reality the device characteristics of the load transistor and the sense transistor may differ. In one embodiment the threshold voltages of the two transistors may be different. This difference in the device characteristics may result from systematic differences in the processes that are used for manufacturing the load transistor and the sense transistor.

Usually the load transistor and the sense transistor are integrated in a common semiconductor body (die, chip), where each of the load transistor and the sense transistor may include a number of transistor cells, that can be produced using identical processes. A first number of transistor cells is connected in parallel, thereby forming the load transistor, and a second number of transistor cells is connected in parallel, thereby forming the sense transistor. The transistor cells of the load and the sense transistor may have a common control terminal and one common first load terminal, but two different second load terminals. If the transistors are MOSFET the control terminal is a gate terminal, the first load terminal may be a drain terminal, and the second load terminals may be source terminals. Producing two different second load terminals (source terminals) may result in process variations that differently influence the threshold voltage of the load transistor cells and the sense transistor cells.

For these and other reasons there is a need for the present invention.

BRIEF DESCRIPTION OF THE DRAWINGS

Examples will now be explained with reference to the accompanying drawings and the description below. The drawings are intended to explain the basic principle. Therefore, only those features relevant for illustrating the basic principle are illustrated. Unless stated otherwise, same reference characters designate the same features with the same meaning throughout the drawings.

DETAILED DESCRIPTION OF THE DRAWINGS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A first embodiment of the present disclosure relates to a semiconductor arrangement, including: a semiconductor body; a number of transistor cells integrated in the semiconductor body, each transistor cell including a first active transistor region; a number of first contact electrodes, each of the contact electrodes contacting the first active transistor regions of at least one transistor cell through contact plugs; a second contact electrode contacting a first group of the first contact electrodes, but not contacting a second group of the first contact electrodes. The transistor cells being contacted by first contact electrodes of the first group form a load transistor, with the second electrode forming a load terminal of the load transistor. The transistor cells being contacted by first contact electrodes of the second group form a sense transistor.

A second embodiment relates to a method for producing a semiconductor arrangement, the method including: providing a semiconductor body, having a number of transistor cells integrated in the semiconductor body, each transistor cell including a first active transistor region; forming a number of first contact electrodes, each of the contact electrodes contacting the first active transistor regions of at least two transistor cells; forming a second contact electrode above the first electrodes, the second contact electrode contacting a first group of the first contact electrodes, but not contacting a second group of the first contact electrodes.

Figure 1:
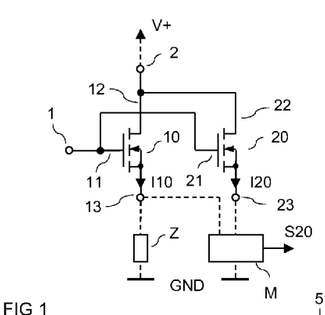
FIG. 1 illustrates a circuit diagram of one embodiment of a semiconductor arrangement including a load transistor and a sense transistor.

FIG. 1 illustrates a circuit diagram of a semiconductor arrangement or transistor arrangement that includes a load transistor 10 and a sense transistor 20. Each of these transistors 10, 20 has a first load terminal 12, 22, a second load terminal 13, 23, and a control terminal 11, 21. Transistors 10, 20 are, for example, MOSFET. In this case the first load terminals 12, 22 are drain terminals, second load terminals 13, 23 are source terminals, and control terminals 11, 21 are gate terminals. It goes without saying that any other kind of transistors, like IGBTs or bipolar transistors, may be used as transistors as well.

Load transistor 10 and sense transistor 20 have their control terminals 11, 21 connected together, thereby forming a control terminal 1 of the transistor arrangement. Further, load transistor 10 and sense transistor 20 have their first load terminals 12, 22 connected together, thereby forming a first load terminal of the transistor arrangement.

The transistor arrangement can be used for switching a current through a load and for simultaneously measuring the current flowing through the load. As illustrated in dashed lines a load path of load transistor 10 may, for this purpose, be connected in series to a load Z between terminals for a first supply potential V+ and a second supply potential GND, where first supply potential V+ may be a positive supply potential and negative supply potential GND may be ground. Load transistor 10 may be switched on and off by applying a suitable control signal to control terminal 1. A load current I10 flowing through load transistor 10 in this transistor arrangement is measured by evaluating a sense current I20 flowing through sense transistor 20. Sense current I20 is proportional to load current I10, if the two transistors 11, 21 have identical device characteristics, and if these two transistors are driven in the same operation point. For operating the two transistors 11, 21 in the same operation point and for measuring a current I20 flowing through sense transistor 20 a control and measurement circuit M may be used that is connected to the second load terminals 13, 23 of the two transistors 10, 20 and that provides a current measurement signal S20 being proportional to the sense current I20. Control and measurement circuits, like control and measurement circuit M according to FIG. 1, are known, so that further explanations are not required in this regard.

The accuracy of the current measurement obtained with a transistor arrangement including a load transistor and a sense transistor may vary with variations in the device characteristics of the load transistor 10 and the sense transistor 20. The two transistors 10, ideally have identical device characteristics. In this case sense current I20 is proportional to load current I10, where a proportionality factor between the sense current I20 and the load current I10 is the ratio between the active transistor areas of the sense transistor 20 and the load transistor 10. However, due to differences in the processes of producing the two transistors the device characteristics of the two transistors 10, 20 may be different. Differences in the production processes may, in one embodiment, result from the need to produce the load transistor 10 and the sense transistor 20 with separate second load terminals 13, 23, with the second load terminal of the load transistor 10 serving for connecting a load Z thereto, and the second load terminal 23 of the sense transistor 20 serving for measuring the sense current I20.

Figure 2:
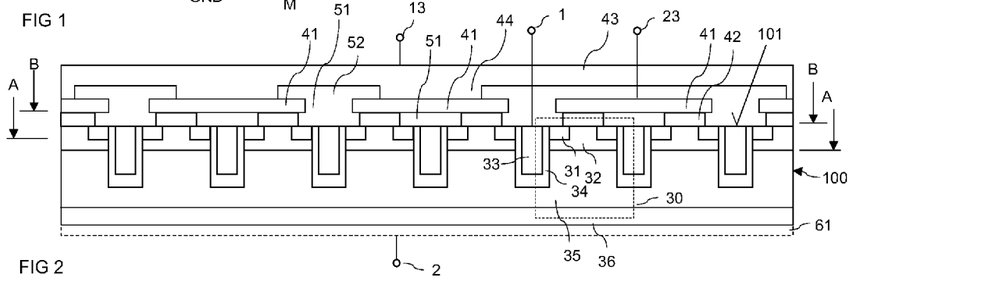
FIG. 2 illustrates a vertical cross section of an example of a semiconductor arrangement including a number of trench transistor cells that form a load transistor and a sense transistor.

An example of a transistor arrangement including a load transistor 10 and a sense transistor 20 that results from a production process that largely avoids differences in processing the load transistor 10 and the sense transistor 20 is illustrated in FIG. 2.

Figure 3:
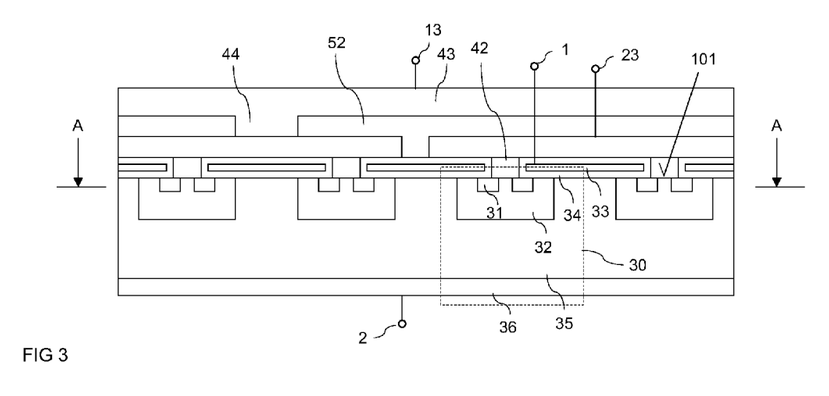
FIG. 3 illustrates a vertical cross section of an example of a semiconductor arrangement including a number of planar transistor cells that form a load transistor and a sense transistor.

FIGS. 2 and 3 illustrate in part a vertical cross section through an integrated semiconductor arrangement including a load transistor 10 and a sense transistor 20. The semiconductor arrangement includes a semiconductor body 100 in which a number of transistor cells 30 are integrated. As an example up to several 10000 (ten thousand), or more, transistor cells may be integrated in a semiconductor body 100. In the example according to FIG. 2 transistor cells 30 are MOSFET cells. Each of these transistor cells include a source zone 31, a drift zone 35 and a body zone 32, the latter being arranged between source zone 31 and drift zone 35. A gate electrode 33 is arranged adjacent to body zone 32 and is dielectrically insulated from body zone 32 by a gate dielectric layer 34. Gate electrode 33 serves to control a conducting channel in the body zone 32 between source zone 31 and drain zone 35 along gate dielectric 34. The transistor cells 30 further include a drain zone 36 that adjoins drift zone 35. Optionally a field-stop zone (not illustrated) may be arranged between the drain zone 36 and drift zone 35.

The body zone 32 is complementarily doped to source zone 31 and to drift zone 35. In an n-channel MOSFET body zone 32 is p-doped, while source and drift zones 31, 35 are n-doped. In an p-channel MOSFET body zone 32 is n-doped, while source zone and drift zones 31, 35 are p-doped. In an MOSFET drain zone 36 has the same doping type as drift zone 35, while in an IGBT drain zone 36 has a doping type that is complementary to the doping type of drift zone 35. In an IGBT source zone 31 and drain zone 36 are also referred to as emitter zone and collector zone, respectively. Source zone 31 is a first active transistor region of the transistor cell, drain zone 36 is a second active transistor region, and gate electrode 33 is a control electrode.

In the example according to FIG. 2 the transistor cells are trench cells. In such cells gate electrode 33 is arranged in a trench that, starting from a first side 101 not illustrated, extends in a vertical direction of the semiconductor body 100. First side 101 will also be referred to as front side of the semiconductor body 100 in the following. In these trench cells source zone 31 and body zone 32 in a lateral direction of the semiconductor body 100 adjoin the gate dielectric 34. If a suitable control potential is applied to the gate electrode 33 a conducting channel extends in a vertical direction of the semiconductor body 100 along gate dielectric 34 between source zone 31 and drift zone 35.

The use of trench transistor cells is only an example. It goes without saying, that any other cell geometry, like planar transistor cells, may be used as well. In planar transistor cells gate electrode 33 is arranged on top of front side 101 of the semiconductor body 100. An example of a transistor arrangement that includes planar transistor cells is illustrated in FIG. 3.

Referring to FIGS. 2 and 3 the transistor cells have drift zone 35 and drain zone 36 in common. Drain zone 36 or an optional electrode 61 (illustrated in dashed lines) that contacts drain zone 36 forms the first load terminal 2 of the transistor arrangement.

For the purpose of further explanation it is assumed that each transistor cell 30 includes one body zone 32, where the body zones 32 of the individual cells are separated from each other by gate electrode 33 in case of trench transistor cells and by sections of drift zone 35 in the case of planar transistor cells.

Figure 4:
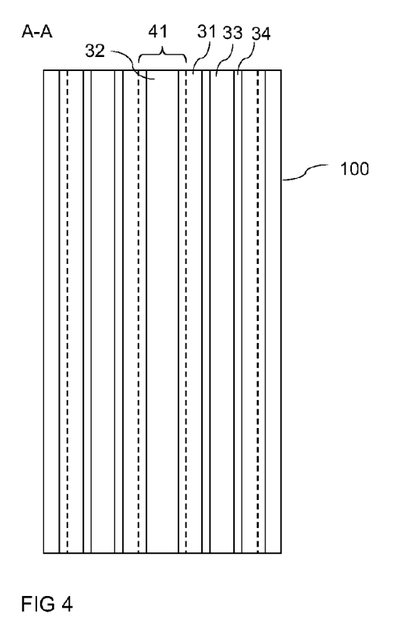
FIG. 4 illustrates a lateral cross section of one embodiment of a semiconductor arrangement including trench transistor cells that have a stripe-like geometry.
Figure 5:
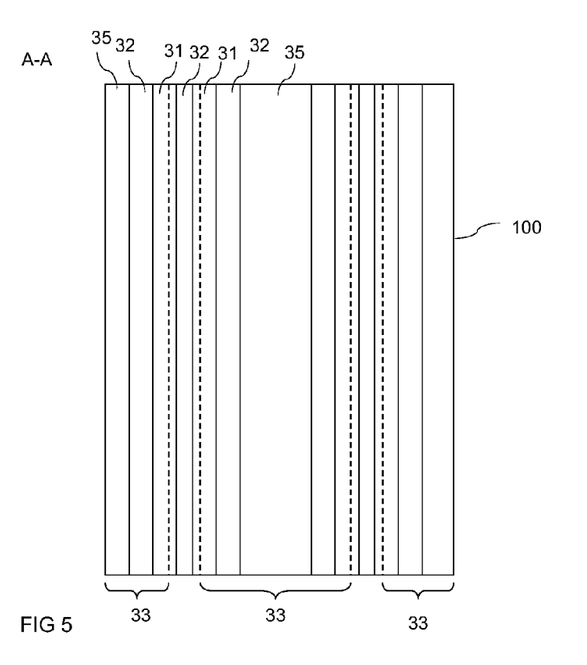
FIG. 5 illustrates a cross section in a first section plane of one embodiment of a semiconductor arrangement including planar transistor cells that have a stripe-like geometry.

In a horizontal plane of the semiconductor body 100 transistor cells 30 may have any known cell geometry, like a linear (stripe) geometry, a rectangular or square geometry, a hexagonal geometry or a circular geometry. The cell geometry is, usually, defined by the geometry of the body zone 32. In linear (stripe) cells body zone 32 has a stripe-geometry. Examples of trench transistor cells and planar transistor cells having a stripe geometry are illustrated in FIGS. 4 and 5 by way of a horizontal cross section through the semiconductor body 100 in a first section-plane A-A. In trench transistor cells the gate electrodes 33 do also have a stripe-geometry, where the body zones 32 of the different cells are arranged between two gate electrodes 33.

Figure 6:
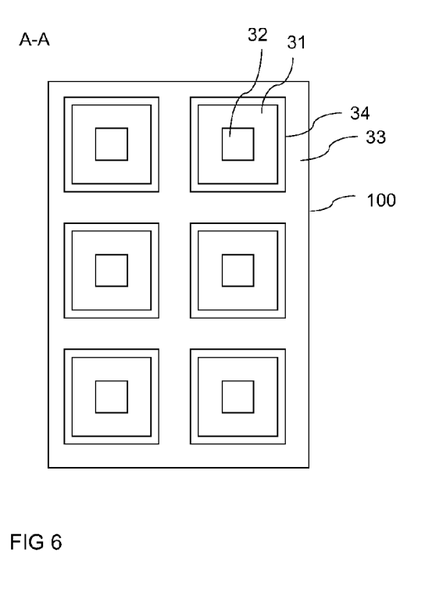
FIG. 6 illustrates a lateral cross section in a first section plane of one embodiment of a semiconductor arrangement including trench transistor cells that have a rectangular geometry.
Figure 7:
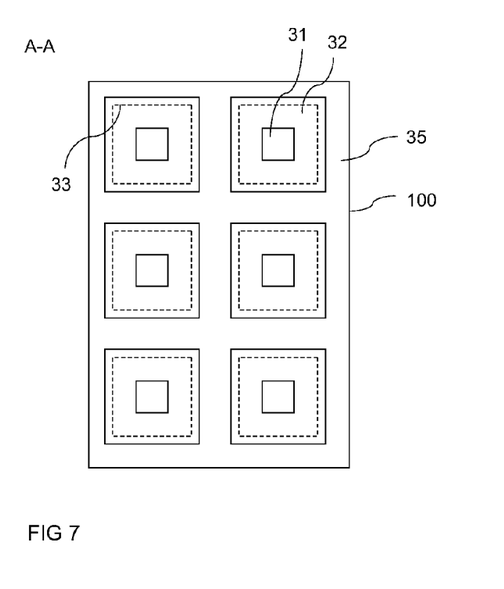
FIG. 7 illustrates a lateral cross section in a first section plane of one embodiment of a semiconductor arrangement including planar transistor cells that have a rectangular geometry.

In rectangular, hexagonal or circular transistor cells body zones 32 have a rectangular, hexagonal or circular geometry. Examples of transistor cells having a rectangular geometry are illustrated in FIGS. 6 and 7 for trench transistor cells (FIG. 6) and planar transistor cells (FIG. 7).

The gate electrodes 33 of the individual transistor cells 30 are electrically connected to each other, thereby forming control electrode 1 of the transistor arrangement. In the semiconductor arrangement having a planar cell geometry only one gate electrode is formed for all transistor cells on top of semiconductor body 100, this gate electrode having contact holes for contacting the source zones 31 of the individual transistor cells.

Referring to FIGS. 2 and 3 the transistor arrangement has a number of first contact electrodes 41, with each of these first contact electrodes 41 electrically contacting the source zones 31 of a given number of transistor cells 30. According to an example each of the first contact electrodes 41 contacts the same number of transistor cells 30. In the example according to FIGS. 2 and 3 each first contact electrode 41 contacts two transistor cells 30. However, this is only an example, each of the first contact electrodes 41 may contact at least one but also any other number higher than one of transistor cells 30. According to one example the number of transistor cells that are contacted by one first contact electrode 41 is less than 100, or even less than 10. Each transistor cell 30 is contacted by only one of the first contact electrodes 41.

First contact electrodes 41 are arranged in a horizontal plane above the semiconductor body 100. This horizontal plane will be referred to as first contact plane in the following. The different first contact electrodes 41 are electrically insulated from each other and from gate electrodes 33 by insulation regions 51. These insulating regions may be comprised of any electrically insulating material, like an oxide or a nitride, that is suitable to be used in semiconductor component manufacturing processes. The first contact electrodes 41 are planar electrodes. "Planar" in this connection means that a thickness (i.e., the dimension in the vertical direction) of the electrodes 41 is smaller than at least one of the width and length of the electrodes. The thicknesses of the first electrodes 41 are, for example, in the range between 0.5 $\mu$m and 1 $\mu$m. The width and/or length of the first electrodes 41 is, for example, less than 10 $\mu$m.

The first contact electrodes 41 contact the transistor cells 30 through contact plugs 42. These contact plugs electrically contact the source zone 31 and the body zone 32, thereby short-circuiting source 31 and body 32. The latter is usual for MOSFET and IGBT. One transistor cell, i.e., the first active transistor region of one transistor cell, is contacted by the associated first contact electrode 41 through at least one contact plug, where more than one contact plug 42 may be arranged between one transistor cell 30 and one first contact electrode 41. In one embodiment in linear transistor cells (that will be explained below) more than one contact plug can be arranged between one transistor cell 30 and the first contact electrode 41. Contact plugs in horizontal direction may have any cross-section, like a rectangular cross-section, a circular cross-section, or a stripe-like cross section.

The transistor arrangement includes a second contact electrode 43 that contacts first contact electrodes of a first group of first contact electrodes 41, but that does not contact first contact electrodes 41 of a second group of first contact electrodes. In the part of the semiconductor arrangements illustrated in FIGS. 2 and 3 one of the first contact electrodes 41 is not contacted by the second contact electrode 43. The first group of first contact electrode includes at least two first contact electrode, and may include up to 100 and more transistor cells.

The second contact electrode 43 is a planar electrode that is arranged in a second electrode plane above the first electrode plane. The thickness of the second electrode 42 is, for example, in the range between 0.5 $\mu$m and 1 $\mu$m. In the example according to FIGS. 2 and 3 an insulation layer 52 is arranged between the first and the second contact plane. The second contact electrode 43 contacts the first electrodes 41 of the first group through contact plugs 44, with these contact plugs 44 being arranged in vias that extend through the insulation layer 52 from the second contact electrode 43 to the first contact electrodes 41 of the first group. The transistor cells 30 that are contacted by first contact electrodes 41 of the first group form the load transistor 10. The second contact electrode 43 is the second load terminal 13 of the load transistor 10. The transistor cells 30 that are contacted by the first contact electrodes 41 of the second group form the sense transistor 20. The first contact electrodes of the second group are electrically connected with each other (not illustrated) and form the second load terminal 23 of sense transistor 20.

Figure 8:
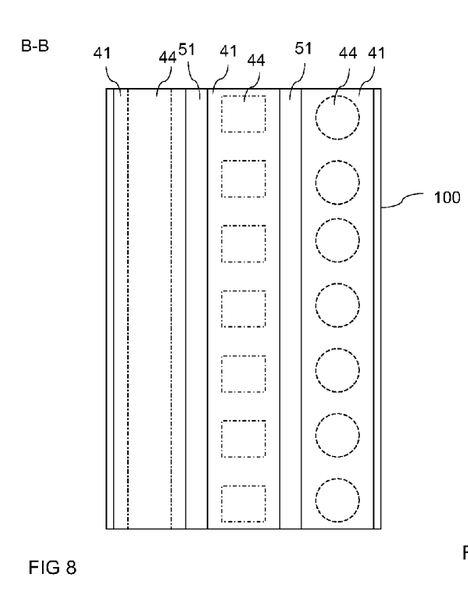
FIG. 8 illustrates a lateral cross section in a second section plane of one embodiment of a semiconductor arrangement including a load and a sense transistor.

Referring to FIG. 8 that illustrates a lateral cross section in a second section plane B-B (see FIGS. 1 and 2) contact plugs 44—or vias in which the contact plugs are arranged—may have a rectangular geometry, a circular geometry or—in case of stripe-shaped first contact electrodes 41—a stripe-like geometry.

The ratio between the number of transistor cells of the sense transistor 20 and the number of transistor cells of the load transistor 10 is the proportionality factor between the sense current I20 and load current I10. This ratio is, for example, in a range between $1:10^4$ (1:E4) to $1:10^6$ (1:E6).

In the present example the second load terminals 13, 23 of the two transistors 10, are formed using first and second electrodes 41, 43 in two electrode layers. In general it would be possible to form the two second load terminals 13, 23 by using only one electrode layer that is split in two electrodes: a first electrode that contacts the transistor cells of the load transistor; and a second electrode that contacts the transistor cells of the sense transistor. However, splitting the electrode layer may involve the use of chemical substances that diffuse into the semiconductor body 100 and that may influence the threshold voltage of the transistor cells. In one embodiment transistor cells that are arranged below the edges of these electrodes can be influenced by such process. Since the number of transistor cells of the load transistor is usually much higher than the number of transistor cells of the sense transistor the proportion of transistor cells that are negatively influenced by splitting the electrode layer is much higher for the sense transistor than for the load transistor. Altogether this results in different threshold voltages of the sense transistor and the load transistor.

When producing the transistor arrangement according to FIGS. 2 and 3 the groups of transistor cells that are contacted by the first contact electrodes 41 are influenced by the process of producing the first electrodes 41 in identical manner. In this connection "a group of transistor cells that are contacted by the first contact electrodes 41" are the transistor cells that are connected by one first contact electrode. These groups include two transistors in the examples according to FIGS. 2 and 3. The groups of transistor cells that are contacted by the individual first contact electrodes 41 do therefore have identical electrical characteristics. If there is a further influence on the device characteristics of these transistor cells by forming the second insulation layer 52, then these transistor cells are influenced by forming this insulation layer 52 in the same manner. Producing vias extending through the second insulation layer 52 to the first electrodes 41 of the first group does not or does only slightly influence the transistor cells below these first electrodes 41 of the first group. Also producing the second contact electrode 43 on top of the second insulation layer 52 and in the vias 44 does not, or does only slightly, influence the device characteristics of the transistor cells.

In case each of the first contact electrodes 41 contacts the same number of transistor cells, with the different cells having the same size, then the ratio between the number of first contact electrodes in the second group is equal to the proportionality factor between the load and the sense current. In the transistor arrangement according to the present example groups of transistor cells that are contacted by the individual first electrodes 41 do therefore have identical device characteristics. Thus, a first arrangement of transistor cells that are contacted by the first electrodes 41 of the first group and a second arrangement of transistor cells that are contacted by the first electrodes 41 of the second group have identical device characteristics. The transistor cells of the first arrangement form the load transistor 10, and the transistor cells of the second arrangement form the sense transistor 20, so that the load and the sense transistor 10, 20 have identical device characteristics.

The geometry of the first contact electrodes 41 is adapted to the geometry of the transistor cells. In case of stripe-cells the first contact electrodes 41 have a stripe-like geometry.

Figure 9:
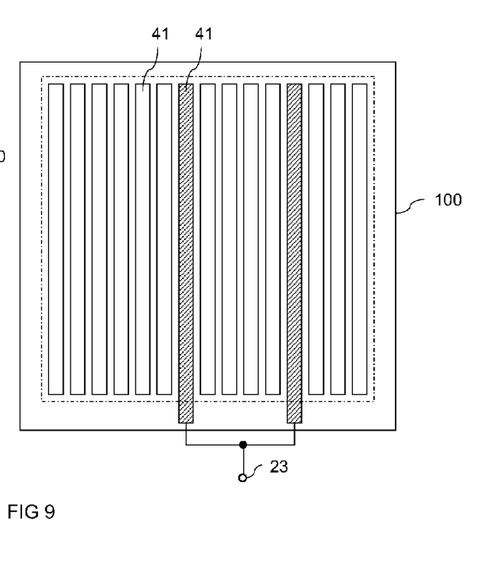
FIG. 9 illustrates a top view on first contact electrodes of a first example of the semiconductor arrangement.

FIG. 9 illustrates an example of a transistor arrangement having stripe-like contact electrodes 41 by way of a cross section through the transistor arrangement in a horizontal section plane B-B. For illustration purposes only a small number of first contact electrodes 41 are illustrated in FIG. 9. In reality dependent on the number of transistor cells 30 the arrangement may include up to several ten thousand or up to several hundred thousand first contact electrodes 41. The second contact electrode 43 is illustrated in dash-dotted lines in FIG. 9. The first contact electrodes 41 of the second group that are not contacted by the second electrode 43 are shaded in FIG. 9. The second contact electrode 43 covers the complete transistor cell area. For contacting the first electrodes 41 of the second group, and for connecting these first electrodes with each other, these first electrodes may extend in a lateral direction beyond the second electrode 43, as it is illustrated in FIG. 9. These first electrode of the second group together form the second load terminal 23 of the sense transistor 20.

Figure 10:
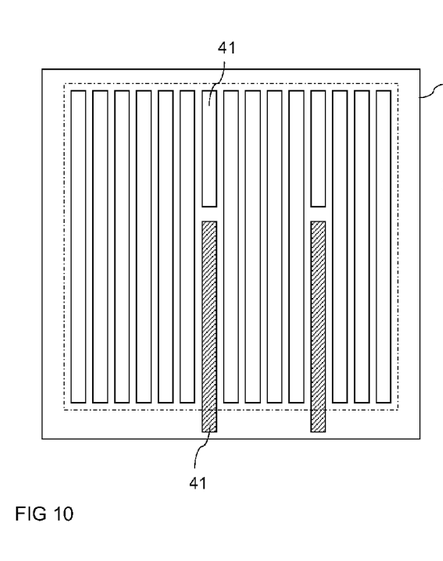
FIG. 10 illustrates a top view on first contact electrode of a second example of the semiconductor arrangement.
Figure 11:
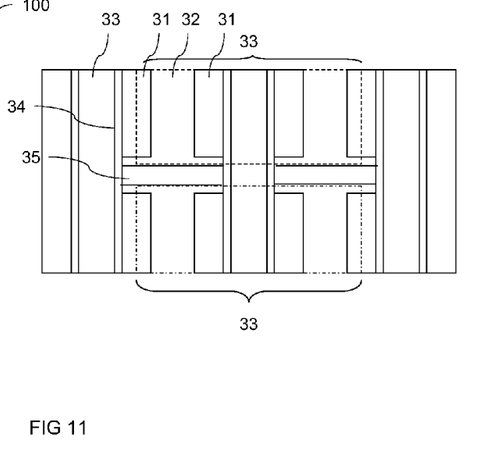
FIG. 11 illustrates the semiconductor arrangement of FIG. 10 in detail.

In the example according to FIG. 9 the transistor cells that are contacted by the first electrodes 41 of the first group and the first electrodes 41 of the second group each extend from edge to edge of the transistor cell area. However, referring to FIGS. 10 and 11 the stripe-shaped transistor cells may be separated in two sub-cells, where a first sub-cell is connected by a first contact electrode 41 of the first group, while a second sub-cell is contacted by a first contact electrode 41 of the second group. FIG. 10 illustrates a horizontal section in section plane B-B of the overall arrangement. FIG. 11 illustrates a section in section plane A-A in an area in which the two sub-cells are arranged next to each other.

Figure 12:
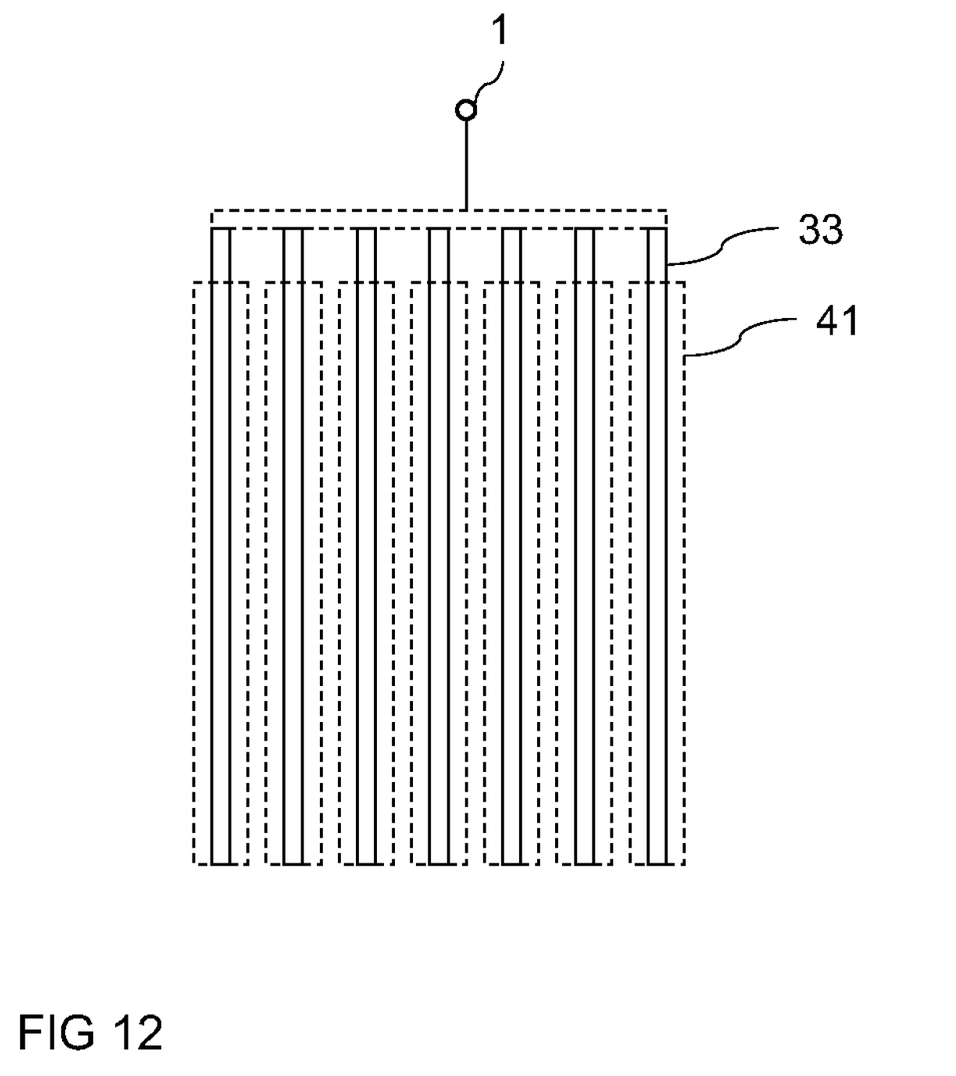
FIG. 12 illustrates a first example for contacting gate electrodes of the transistor cells.

In a transistor arrangement having trench transistor cells with a stripe-like geometry the trenches with the gate electrodes may extend beyond the first contact electrodes 41 in a lateral direction, where the gate electrodes 33 may be contacted in those areas that are not overlapped by the first contact electrodes 41. FIG. 12 illustrates a section in section plane A-A of such arrangement, where in FIG. 12 only the gate electrodes 33 are illustrated. Illustrated in dashed lines are the first contact electrodes 41, which in this example do not completely overlap gate electrodes 33. Gate electrodes 33 are electrically connected with each other in the area that is not overlapped by the first contact electrodes 41 and the second electrode 43 (not illustrated in FIG. 12). These gate electrodes 33 may be contacted with each other using a trench that runs perpendicular to the trenches with the gate electrodes 33 and that includes a contact electrode contacting the gate electrodes 33 in the individual trenches. The gate electrodes 33 that are connected with each other in this manner form the control electrode 1 of the transistor arrangement.

Further electrode layers may be arranged on top of the semiconductor arrangement, for example to contact the gate terminal or for integrating logic circuitry.

Figure 13:
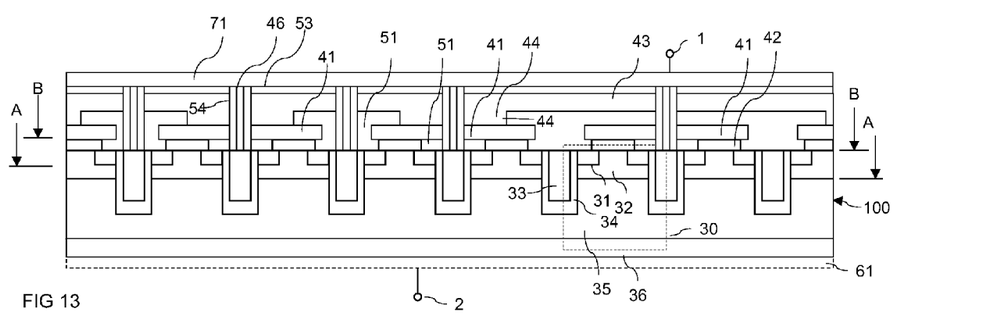
FIG. 13 illustrates a vertical cross section of a semiconductor arrangement according to a further example.

As an example, a third electrode layer 71 may be arranged above the second electrode 43 and insulated from second electrode 43 by a further insulation layer 53. Third electrode 71 forms the control electrode 1 and contacts the different gate electrodes 31 through contact plugs 46 that extend in a vertical direction to the gate electrodes 33 and that are insulated from the second electrode 43 and the first electrodes 41 by insulation layers 54 that surrounds the contact plugs 46.

A method for producing a semiconductor arrangement according to FIG. 2 will now be illustrated with reference to FIGS. 14A to 14G. these figures illustrate cross sections through the semiconductor arrangement during different method steps of producing the semiconductor arrangement.

Figure 14A:
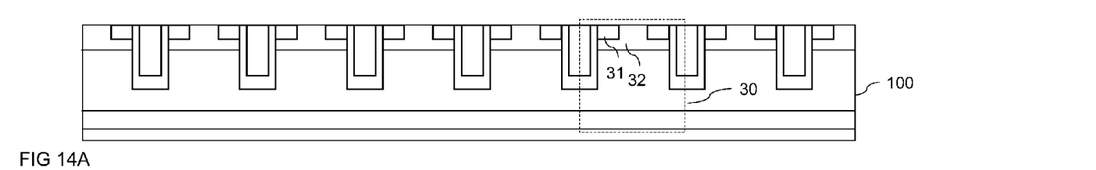
FIG. 14 illustrates a method for producing a semiconductor arrangement including a load and a sense transistor.

Referring to FIG. 14A a semiconductor body 100 is provided in which a number of transistor cells 30 is integrated. These transistor cells may have any transistor cell geometry as discussed above.

Figures 14B, 14C:
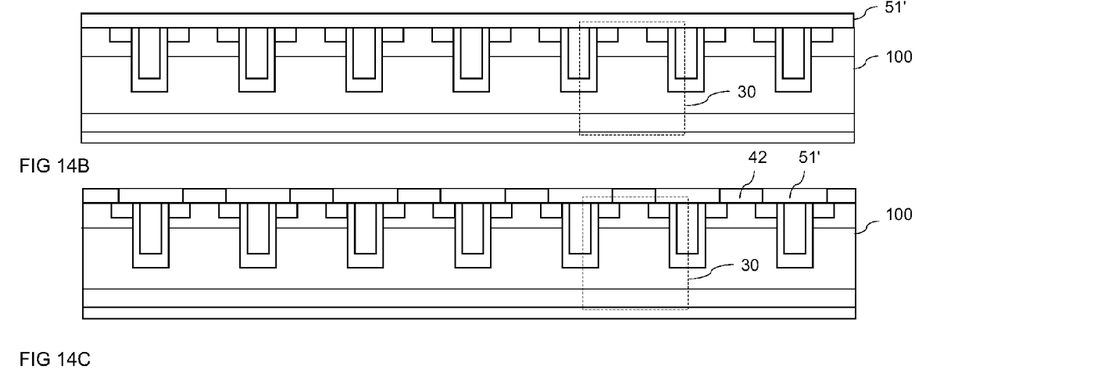

In next method processes that are illustrated in FIGS. 14B and 14C, contact plugs 42 that contact the source zones 31 and the body zones 32 of the transistor cells 30 are produced. These method processes include, for example, depositing a first insulation layer 51A on the first side 101 of the semiconductor body 100 (see FIG. 14B). Insulation layer 51' may be an oxide or a nitride layer. Then, vias are produced in the insulation layer 51A above source and body zones 31, 32 of the transistor cells 30, where these vias are filled with an electrode material for forming the contact plugs 42. Forming the contact plugs 42 may include depositing an electrode material and etching or polishing the contact material down to the insulation layer 51A. Contact plugs may be formed of a metal, like, for example, aluminum, copper, tungsten, . . . .

Figure 14D:
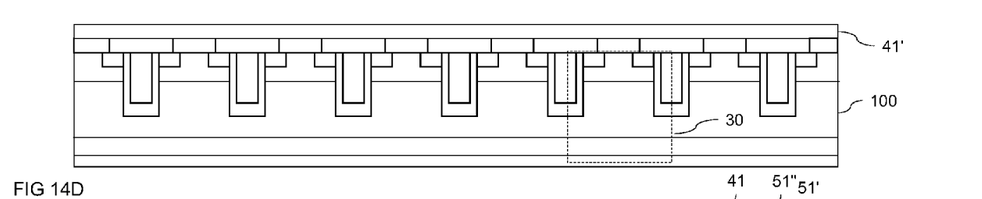

Referring to FIG. 14D a first electrode layer 41' is deposited on the contact plugs 42 and the remaining sections of the first insulation layer. The material of the first electrode layer may correspond to the material of the contact plugs. However, any other electrically conducting material may be used as well. The contact plugs 42 and the first electrode layer 41' may be formed in one process step, in which an electrode material is deposited in the vias of the insulation layer 51' and on top of insulation layer 51'.

Figure 14E:
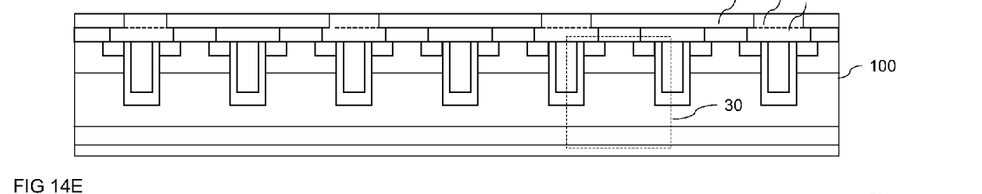

Referring to FIG. 14E this first electrode layer 41' is split in different pieces, with each of these pieces forming one of the first electrodes 41. Splitting first electrode layer 41' into pieces may involve etching trenches into the electrode layer 41' and filling these trenches with an electrically insulating material. Filling these trenches with the insulating material may include depositing a second insulating layer 51" and etching or polishing the deposited material down to the first electrodes. The second insulating layer 51" may be comprised of the same material as the first insulating layer 51'. The remaining sections of the first and second insulation layers 51', 51" form the insulation regions 51 according to FIGS. 2 and 3 that insulate the first electrodes 41 from each other and the gate electrodes 33.

Figure 14F:
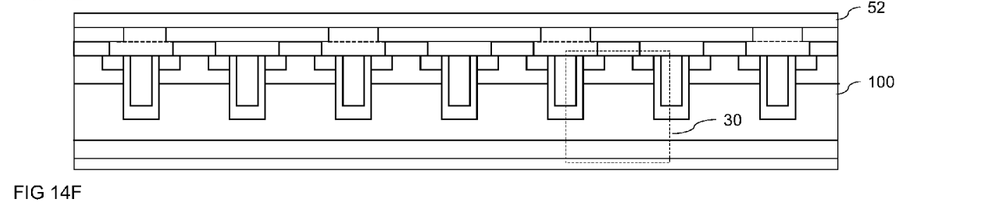

Referring to FIG. 14F a further insulation layer 52 is deposited on the first electrodes 41. This layer may be comprised of the same material as first and second insulation layers 51', 51".

Figure 14G:
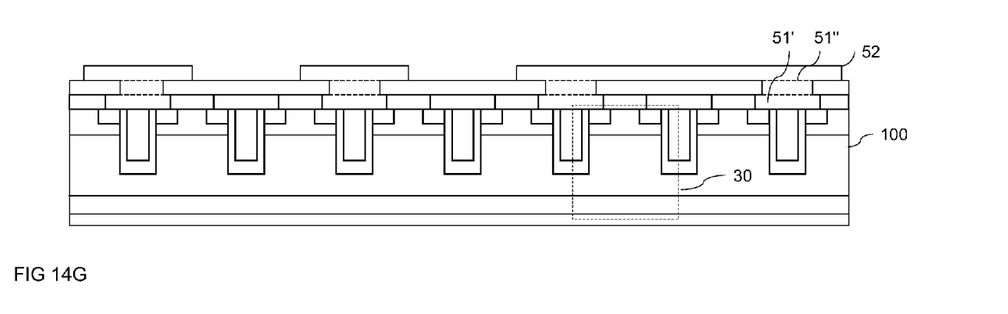

Referring to FIG. 14G vias are formed in the further insulation layer 52 above the first contact electrodes 41 of the first group.

Having produced the vias in the second insulation layer 52 a further electrode layer is deposited, this further electrode layer forming the second contact electrode 43 (illustrated in FIG. 2).

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor arrangement, comprising:
a semiconductor body;
a number of transistor cells integrated in the semiconductor body, each transistor cell comprising a first active transistor region;
a number of first contact electrodes, each of the first contact electrodes contacting the first active transistor region of at least one transistor cell through a contact plug;
a second contact electrode contacting a first group of the first contact electrodes, but not contacting a second group of the first contact electrodes, the first group of first contact electrode including at least two first contact electrodes;
transistor cells being contacted by first contact electrode of the first group forming a load transistor, with the second contact electrode forming a load terminal of the load transistor; and
transistor cells being contacted by first contact electrode of the second group forming a sense transistor,
wherein the first contact electrodes are planar electrodes, and
wherein the first contact electrodes have a thickness, a width and a length, with the thickness being smaller than at least one of the width and the length.

2. The semiconductor arrangement of claim 1, in which each of the first contact electrodes contacts the first active transistor regions of two or more transistor cells.

3. The semiconductor arrangement of claim 2, in which of the first contact electrodes contacts the first active transistor regions of less than 100 transistor cells.

4. The semiconductor arrangement of claim 1, in which the first contact electrodes each contact a same number of transistor cells.

5. The semiconductor arrangement of claim 4, in which the first contact electrode each contact two transistor cells.

6. The semiconductor arrangement of claim 1, in which the first contact electrodes are arranged above the semiconductor body and are insulated from one another by insulation regions.

7. The semiconductor arrangement of claim 6, in which the second contact electrode is arranged above the first contact electrodes.

8. The semiconductor arrangement of claim 7, further comprising:
an insulation layer arranged between the first contact electrodes and the second contact electrode; and
contact plugs extending through the insulation layer from the second electrode to the first contact electrodes of the first group.

9. The semiconductor arrangement of claim 1, in which the transistor cells have a geometry being selected from one of the following: hexagonal, rectangular, linear, circular.

10. A semiconductor arrangement, comprising:
a semiconductor body;
a number of transistor cells integrated in the semiconductor body, each transistor cell comprising a first active transistor region;
a number of first contact electrodes, each of the first contact electrodes contacting the first active transistor region of at least one transistor cell through a contact plug;
a second contact electrode contacting a first group of the first contact electrodes, but not contacting a second group of the first contact electrodes, the first group of first contact electrode including at least two first contact electrodes;
transistor cells being contacted by first contact electrode of the first group forming a load transistor, with the second contact electrode forming a load terminal of the load transistor;
transistor cells being contacted by first contact electrode of the second group forming a sense transistor;
a second active transistor region; and
a gate electrode,
wherein the transistor cells are trench MOSFET cells that have the gate electrode arranged in a trench of the semiconductor body.

11. The semiconductor arrangement of claim 10, in which the transistor cells comprise one common second active transistor region.

12. The semiconductor arrangement of claim 10, in which at least two gate electrodes are connected to one common gate terminal.

13. The semiconductor arrangement of claim 10, in which the transistor cells are MOSFET cells, with the first active transistor regions being source regions.

14. A semiconductor arrangement, comprising:
- transistor cells integrated in a semiconductor body, each transistor cell comprising a first active transistor region;
- first contact electrodes, each of the first contact electrodes contacting the first active transistor region through a contact plug;
- a second contact electrode contacting a first group of the first contact electrodes, but not contacting a second group of the first contact electrodes, the first group of first contact electrode including at least two first contact electrodes;
- transistor cells being contacted by first contact electrode of the first group forming a load transistor, with the second contact electrode forming a load terminal of the load transistor; and
- transistor cells being contacted by first contact electrode of the second group forming a sense transistor,
- wherein the first contact electrodes are planar electrodes, and
- wherein the first contact electrodes have a thickness, a width and a length, with the thickness being smaller than at least one of the width and the length.

* * * * *